(12) United States Patent
Ariga et al.

(10) Patent No.: US 7,974,327 B2
(45) Date of Patent: Jul. 5, 2011

(54) SURFACE EMITTING LASER ELEMENT ARRAY

(75) Inventors: Maiko Ariga, Tokyo (JP); Takeo Kageyama, Tokyo (JP); Norihiro Iwai, Tokyo (JP); Kazuaki Nishikata, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 275 days.

(21) Appl. No.: 12/224,719

(22) PCT Filed: Sep. 1, 2006

(86) PCT No.: PCT/JP2006/317368
§ 371 (c)(1),
(2), (4) Date: Sep. 4, 2008

(87) PCT Pub. No.: WO2007/105328
PCT Pub. Date: Sep. 20, 2007

(65) Prior Publication Data
US 2010/0195689 A1    Aug. 5, 2010

(30) Foreign Application Priority Data
Mar. 14, 2006    (JP) .................................. 2006-068567

(51) Int. Cl.
*H01S 5/183*    (2006.01)
*H01S 5/42*    (2006.01)
(52) U.S. Cl. .............. 372/50.124; 372/50.12; 372/38.05
(58) Field of Classification Search .............. 372/50.12, 372/50.124, 46.01
See application file for complete search history.

(56) References Cited

U.S. PATENT DOCUMENTS
2006/0227836 A1* 10/2006 Omori et al. ............ 372/50.124
2007/0025407 A1* 2/2007 Koelle .................... 372/50.124

FOREIGN PATENT DOCUMENTS
JP    06-291414    10/1994
JP    2003-037336    2/2003
* cited by examiner

*Primary Examiner* — Minsun Harvey
*Assistant Examiner* — Michael Carter
(74) *Attorney, Agent, or Firm* — Kubotera & Associates, LLC

(57) ABSTRACT

A surface emitting laser element array comprises a plurality of surface emitting laser elements (15) on a same substrate (1) each comprising a mesa post formed of a laminated structure including an active layer (4) for reducing a crosstalk between the surface emitting laser elements constituting the surface emitting laser element array, and for improving a high speed response, wherein each of the surface emitting laser elements (15) comprises a first electrode (9), a second electrode (10) and a third electrode (11) that have a polarity different from that of the first electrode (9); the first electrode (9) is arranged on the mesa post; the second electrode (10) is arranged on one surface of the substrate (1) same as that of the first electrode (9); the third electrode (11) is arranged on the other surface of the substrate (1) opposite to that of the first electrode and the second electrode (9, 10) and is provided as a common electrode of the surface emitting laser elements (15); and an electric current is applied to the active layer (4) using the first electrode (9) and the second electrode (10).

20 Claims, 6 Drawing Sheets

Output light

US 7,974,327 B2

SURFACE EMITTING LASER ELEMENT ARRAY

TECHNICAL FIELD

The present invention relates to a surface emitting laser element array formed of a plurality of surface emitting laser elements disposed on a same substrate. Each of the surface emitting laser elements includes a mesa post part and a resonator structure in a vertical direction relative to the substrate. More specifically, the present invention relates to an arrangement of electrodes of a surface emitting laser element array.

BACKGROUND ART

A vertical cavity surface emitting laser (VCSEL: simply referred to as a surface emitting laser element hereinafter) is a semiconductor laser element for emitting light in an orthogonal direction relative to a substrate. It is possible to arrange a plurality of semiconductor laser elements in a two-dimensional array pattern on a same substrate. The surface emitting laser element has been applied as a light source for communication and a device for a variety of other applications. Regarding such the surface emitting laser element, as a communication speed increases to 2.5 Gbps and 10 Gbps or faster, it is required to provide a surface emitting laser element and a surface emitting laser element array that are superior in high frequency response, or a laser module that a surface emitting laser element and a surface emitting laser element array are built therein.

In the surface emitting laser element, one pair of semiconductor multilayer reflecting mirrors (for example, Al(Ga)As/Ga(Al)As or the like as a GaAs base) is formed on a semiconductor substrate formed of a material such as a GaAs, an InP, or the like, and an active layer as a light emission region is disposed between the pair of the reflecting mirrors. In particular, it is possible to form a GaAs based surface emitting laser element on a GaAs substrate, and it is possible to use an AlGaAs based DBR mirror having a preferable thermal conductivity and a high reflectivity. Accordingly, the GaAs based surface emitting laser element is promising as a laser element capable of emitting laser light with a wavelength band of between 0.8 µm and 1.0 µm. Moreover, a surface emitting laser element in which a GaInNAs based material is used for an active layer is promising as a surface emitting laser element capable of emitting light in a long wavelength region between 1.2 µm and 1.6 µm. Among the surface emitting laser elements, there is developed a surface emitting laser element of an oxide confined type, in which an Al oxide layer confines an electric current injection region for enhancing a current efficiency and reducing a threshold current value.

A configuration of a conventional surface emitting laser element of the oxide confined type with a wavelength band of 850 nm will be described in detail below with reference to FIG. 7. A surface emitting laser element 30 is formed of a laminated structure of a lower part DBR mirror 34, a lower part cladding layer 36, a quantum well active layer 38, an upper part cladding layer 40, and an upper part DBR mirror 42 disposed on an n-GaAs substrate 32. The lower part DBR mirror 34 is formed of thirty-five pairs of n-$Al_{0.9}Ga_{0.1}As$/n-$Al_{0.2}Ga_{0.8}As$ each having a layer thickness of $\lambda/4n$ ($\lambda$ is an emission wavelength, and n is a refractive index). The upper part DBR mirror 42 is formed of twenty-five pairs of p-$Al_{0.9}Ga_{0.1}As$/p-$Al_{0.2}Ga_{0.8}As$ each having a layer thickness of $\lambda/4n$ ($\lambda$ is an emission wavelength, and n is a refractive index).

In the upper part DBR mirror 42, one layer near the quantum well active layer 38 is formed of an AlAs layer 44 in place of the $Al_{0.9}Ga_{0.1}As$ layer. Further, Al in the AlAs layer 44 at a region except a current injection region is selectively oxidized to form a current blocking layer formed of an Al oxide layer 45.

In the laminated structure, the upper part DBR mirror 42 is processed to be a mesa post having a round shape with a diameter of 30 µm up to the nearest layer thereof to the quantum well active layer 38 below the AlAs layer 44 through a photolithography treatment and an etching process. In forming the mesa post, all of semiconductors except a region of the mesa post are removed through etching. Alternatively, a ditch groove with an annular shape is formed through etching, and the mesa post is formed inside the ditch groove with the annular shape. The laminated structure formed in the mesa post is processed in an oxidation process in water vapor at a temperature of approximately 400° C., so that Al in the AlAs layer 44 is selectively oxidized from outside the mesa post to form the current blocking layer formed of the Al oxide layer 45.

A polyimide layer 46, for example, is embedded in a surrounding region of the mesa post. An electrode having a ring shape is provided as a p-side electrode 48 to contact with an outer circumference of a top surface of the mesa post in a width of approximately between 5 µm and 10 µm. After a backside surface of the substrate 32 is properly polished to have a substrate thickness of, for example, 200 µm, an n-side electrode 50 is formed on the backside surface of the substrate 32. An electrode pad 52 is formed on the polyimide 46 to contact with the p-side electrode 48 for connecting to an external terminal with a wire. In the surface emitting laser element 30 having the configuration described above, an electric current flows between the n-side electrode 50 on the backside surface of the substrate 32 and the p-side electrode 48 on the upper region of the mesa post. Accordingly, an electrically conductive semiconductor substrate with an impurity of n-type or p-type doped therein is used (refer to Patent Reference 1).

As shown in FIG. 8, as a surface emitting laser element having an electrode arrangement capable of responding at a high speed, in a surface emitting laser element 60 having a mesa post, an n-type electrode 71 is provided on an upper region of the mesa post. A p-type electrode 72 is provided on a lower part cladding layer 67 at a same surface side as a semi-insulating semiconductor substrate 61. In the surface emitting laser element 60, a lower part DBR mirror formed of a p-type semiconductor multilayered layer 62 having a relatively high resistivity does not become a current path. Accordingly, it is possible to reduce a resistance of the element. In the figure, 63 designates a lower part cladding layer, 64 designates an active layer, 65 designates an upper part cladding layer, 66 designates a lower part cladding layer, 68 designates a current blocking layer, 69 designates an upper part cladding layer, and 70 designates a semiconductor multilayered layer (refer to Patent Reference 2).

The surface emitting laser element array is formed of a plurality of the surface emitting laser elements arranged on a same semiconductor substrate.

Patent Reference 1: Japanese Patent Application Publication No. 2003-037336
Patent Reference 2: Japanese Patent Application Publication No. H06-291414

DISCLOSURE OF THE INVENTION

Problems to be Solved by the Invention

As described above, in the surface emitting laser element array, in which each of the surface emitting laser elements is provided with the p-side electrode and the n-side electrode on the top surface of the mesa post and the backside surface of the substrate, respectively, the semiconductor substrate and the lower part DBR mirror have electrical conductivity for injecting an electric current into the active layer of the surface emitting laser element. Therefore, each of the surface emitting laser elements is electrically connected to each other, so that electrical interference (crosstalk) tends to occur between each of the surface emitting laser elements. Moreover, the surface emitting laser element has a relatively large electric capacity and a relatively large resistance value, thereby making it difficult to obtain preferable response at a high frequency.

On the contrary, in the surface emitting laser element, in which the p-side electrode and the n-side electrode are provided on the top surface of the mesa post and the lower part cladding layer at the same surface side of the substrate, respectively, it is possible to reduce the electric capacity and the resistance value of the surface emitting laser element, thereby improving high speed response. However, ground electrodes of the surface emitting laser elements are arranged apart from each other, so that a ground potential of each of the surface emitting laser element tends to vary due to an effect of an inductance and a resistance to the ground electrode. As a result, crosstalk tends to occur between each of the surface emitting laser elements.

In view of the problems mentioned above, an object of the present invention is to provide a surface emitting laser element array comprising a plurality of surface emitting laser elements disposed on a same substrate. Each of the surface emitting laser elements has a constant ground potential, and is superior in high speed response.

Means for Solving the Problem

According to the present invention, a surface emitting laser element array comprises a plurality of surface emitting laser elements disposed on a same substrate. Each of the surface emitting laser elements includes a mesa post formed of a laminated structure including at least an active layer formed of a semiconductor layer. Each of the surface emitting laser elements comprises a first electrode, a second electrode, and a third electrode. The second electrode and the third electrode have a polarity different from that of the first electrode. The first electrode is arranged on the mesa post; the second electrode is arranged on one surface of the substrate same as that of the first electrode; and the third electrode is arranged on the other surface of the substrate opposite to that of the first electrode and the second electrode as a common electrode of the surface emitting laser elements. An electric current is applied to the active layer using the first electrode and the second electrode.

Effects of the Invention

According to the surface emitting laser element array of the present invention, in each of the surface emitting laser elements, the first electrode is arranged on the mesa post, the second electrode is arranged on the surface of the substrate as same that of the first electrode, and the third electrode is arranged on the surface of the substrate opposite to that of the first and the second electrodes. The electric current is applied to the active layer using the first electrode and the second electrode. Accordingly, an electric capacity and a resistance value of the surface emitting laser element decrease, thereby improving high speed response. Further, the third electrode is provided as the common electrode for a plurality of the surface emitting laser elements. Accordingly, each of the surface emitting laser elements has a constant ground potential, thereby reducing crosstalk.

BRIEF DESCRIPTION OF THE DRAWINGS

FIG. 4-1 is a cross sectional view showing a configuration and a current path regarding a mesa post of a surface emitting laser element provided in a surface emitting laser element array according to the second embodiment.

FIG. 4-2 is a view showing a current density distribution in a radial direction in the vicinity of a current blocking layer shown in FIG. 4-1.

FIG. 5-1 is a cross sectional view showing a configuration and a current path regarding a mesa post in a case of excluding a current equalizer layer from the surface emitting laser element shown in FIG. 4-1.

FIG. 5-2 is a view showing a current density distribution in a radial direction in the vicinity of a current blocking layer shown in FIG. 5-1.

DESCRIPTION OF THE REFERENCE SYMBOLS

1 SUBSTRATE
2 LOWER PART DBR MIRROR
2a FIRST LOWER PART DBR MIRROR
2b SECOND LOWER PART DBR MIRROR
3, 3' LOWER PART CLADDING LAYER
4 ACTIVE LAYER
5 UPPER PART CLADDING LAYER
6 UPPER PART DBR MIRROR
7 APERTURE
8 CURRENT BLOCKING LAYER
9 FIRST ELECTRODE
10 SECOND ELECTRODE
11 THIRD ELECTRODE
12 POLYIMIDE LAYER
13, 14 ELECTRODE PAD
15, 15' SURFACE EMITTING LASER ELEMENT
16 SURFACE EMITTING LASER ELEMENT ARRAY
17 MOUNT SUBSTRATE
18 GROUND ELECTRODE
19 BONDING WIRE
20 SIGNAL INPUT ELECTRODE
21, 21' CURRENT EQUALIZER LAYER
22 HIGH ELECTRICAL RESISTIVITY LAYER
23 LOW ELECTRICAL RESISTIVITY LAYER

BEST MODE FOR CARRYING OUT THE INVENTION

Embodiments of a surface emitting laser element array according to the present invention will be described in detail below with reference to the drawings. Here, the present invention is not limited to the embodiments. Moreover, a similar part is designated using the similar symbol regarding a description for each of the drawings.

The First Embodiment

Figure 1:
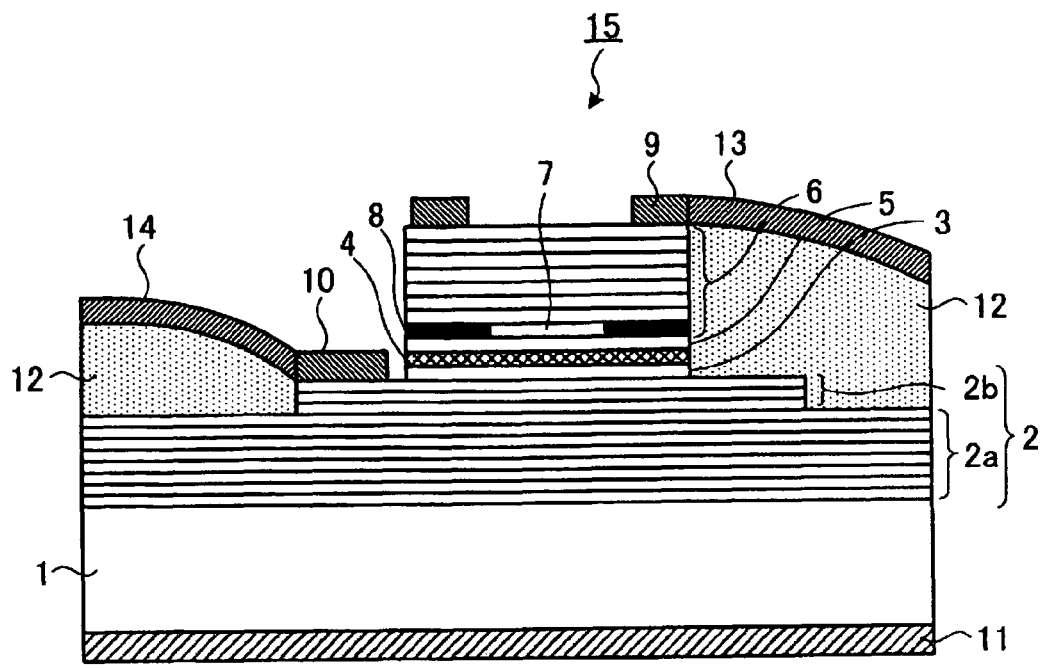
FIG. 1 is a cross sectional view showing a configuration of a surface emitting laser element provided in a surface emitting laser element array according to the first embodiment.

FIG. 1 is a cross sectional view showing a part for one surface emitting laser element to comprise a surface emitting laser element array according to the first embodiment. In FIG. 1, a surface emitting laser element 15 comprises a laminated structure on a semi-insulating semiconductor substrate 1 in which a lower part DBR mirror 2 laminated pairs of n-$Al_{0.9}Ga_{0.1}As$/n-$Al_{0.2}Ga_{0.8}As$ to be a multilayer with each layer thickness of $\lambda/4n$ ($\lambda$ is an emission wavelength, n is a refractive index) respectively, a lower part cladding layer 3, an active layer 4, an upper part cladding layer 5, and an upper part DBR mirror 6 laminated pairs of p-$Al_{0.9}Ga_{0.1}As$/p-$Al_{0.2}Ga_{0.8}As$ to be a multilayer with each layer thickness of $\lambda/4n$ ($\lambda$ is an emission wavelength, n is a refractive index) respectively, are laminated in order thereupon.

Moreover, the lower part DBR mirror 2 is formed as a configuration in which a second lower part DBR mirror 2b formed of a several layers of being enhanced an electrical conductivity by doping an n-type impurity is laminated on a first lower part semi-insulating DBR mirror 2a. Further, the upper part DBR mirror 6 is formed of a semiconductor layer having an electrical conductivity by being doped a p-type impurity, wherein one layer thereof at the nearest side to the active layer 4 is formed of an AlAs layer in place of the $Al_{0.9}Ga_{0.1}As$ layer, and formed of a current blocking layer 8 formed of an Al oxide layer that the AlAs layer at a region except an open part (an aperture) 7 as an electric current injection region is selectively oxidized.

Still further, the laminated structure from the second lower part DBR mirror 2b to the upper part DBR mirror 6 including the active layer 4 has a shape of a mesa post. Still further, the second lower part DBR mirror 2b is formed of a semiconductor layer having an electrical conductivity by being doped an n-type impurity, and it has a diameter larger than that of other parts. Still further, there is arranged a first electrode (a p-side electrode) 9 as a ring shape at a top surface of the upper part DBR mirror 6.

Still further, there is arranged a second electrode (an n-side electrode) 10 as a half-ring shape at a top surface of the second lower part DBR mirror 2b. Still further, a third electrode (a ground electrode) 11 is formed at a surface opposite to the mesa post of the semiconductor substrate 1. Here, the first electrode (p-side electrode) 9 and the second electrode (n-side electrode) 10 are provided individually to drive the individual surface emitting laser elements, on the contrary, the third electrode (ground electrode) 11 is provided as a common electrode for a plurality of the surface emitting laser elements on the same substrate 1.

Furthermore, the surface emitting laser element array is buried by a polyimide layer 12, and there are provided electrode pads 13 and 14 connected to the first electrode (p-side electrode) 9 and to the second electrode (n-side electrode) 10 on the polyimide layer 12, respectively.

Figure 2:
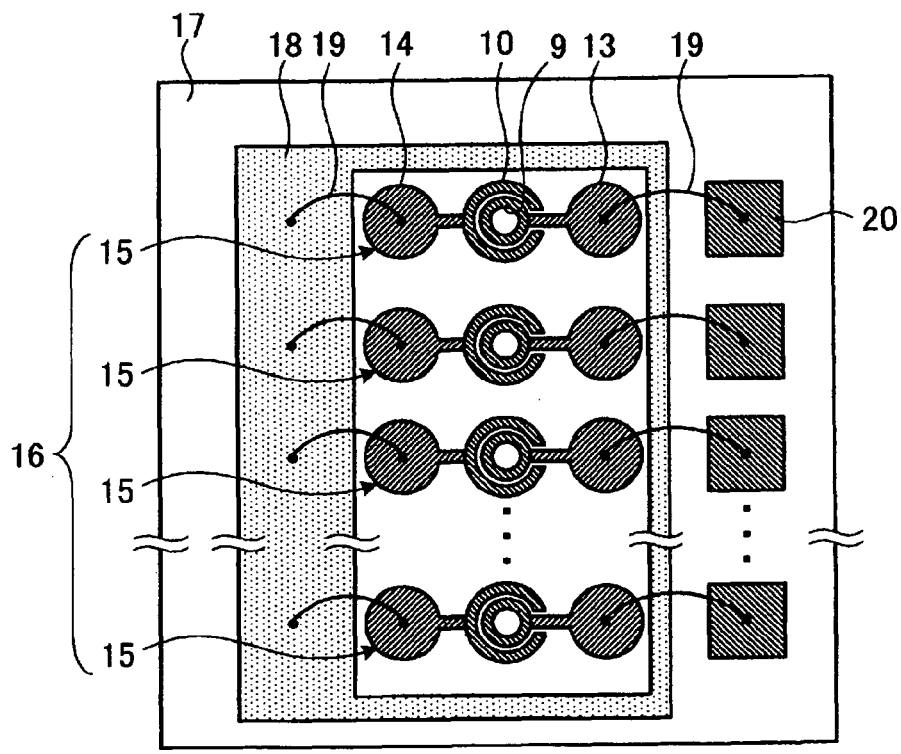
FIG. 2 is a plane view showing a configuration of the surface emitting laser element array according to the first embodiment.

FIG. 2 is a partial plane view showing a state of a surface emitting laser element array 16 according to the present first embodiment to be mounted on a mount substrate 17. In FIG. 2, the surface emitting laser element array 16 comprises a plurality of the surface emitting laser elements 15 arranged with sharing the substrate 1, and then mounted on the mount substrate 17 in a laser module. In such the state, the third electrode 11 is mounted on a ground electrode 18 on the mount substrate 17 to be electrically contacted therewith, meanwhile, the second electrode 10 is electrically contacted to the ground electrode 18 on the mount substrate 17 with a bonding wire 19 via the electrode pad 14. As a result, the second electrode 10 and the third electrode 11 of the individual surface emitting laser elements 15 are electrically connected therebetween. Moreover, the first electrode 9 is electrically contacted to a signal input electrode 20 on the mount substrate 17 with the bonding wire 19 via the electrode pad 13.

An aspect of the present first embodiment different from conventional technologies, the first electrode (p-side electrode) 9 is arranged at the top surface of the upper part DBR mirror 6, the second electrode (n-side electrode) 10 is arranged as the half-ring shape at the top surface of the second lower part DBR mirror 2b, and then the third electrode (ground electrode) 11 is formed on the surface (backside) of the semiconductor substrate 1 on the other side of the mesa post.

Because of such the configuration, an electric current for driving the individual surface emitting laser elements 15 does not pass through via the first lower part semi-insulating DBR mirror 2a and the semiconductor substrate 1. Therefore, a device resistance and a device capacitance are reduced, and then the high speed response becomes to be improved. Moreover, any adjacent pair of the individual surface emitting laser elements 15 are connected therebetween using only the first lower part DBR mirror 2a formed of the semi-insulating semiconductor layer and the semi-insulating semiconductor substrate 1. Hence, a current for driving one of the surface emitting laser elements 15 rarely flows around into the other of the surface emitting laser elements 15, thereby reducing a crosstalk between the surface emitting laser elements 15 even though being disposed on the same substrate 1. Further, the ground potential of the individual surface emitting laser elements 15 becomes to be equivalent, because the individual surface emitting laser elements 15 is connected to the common third electrode (ground electrode) 11 formed on the backside surface of the semi-insulating substrate 1. Accordingly, it is possible to obtain an advantage of preventing the crosstalk between the individual surface emitting laser elements 15.

Here, according to the present first embodiment, the second lower part DBR mirror 2b is formed using the n-type semiconductor and the upper part DBR mirror 6 is formed using the p-type semiconductor, however, it may be also available to form the upper part DBR mirror 6 using the n-type semiconductor and to form the second lower part DBR mirror 2b using the p-type semiconductor.

Figure 3:
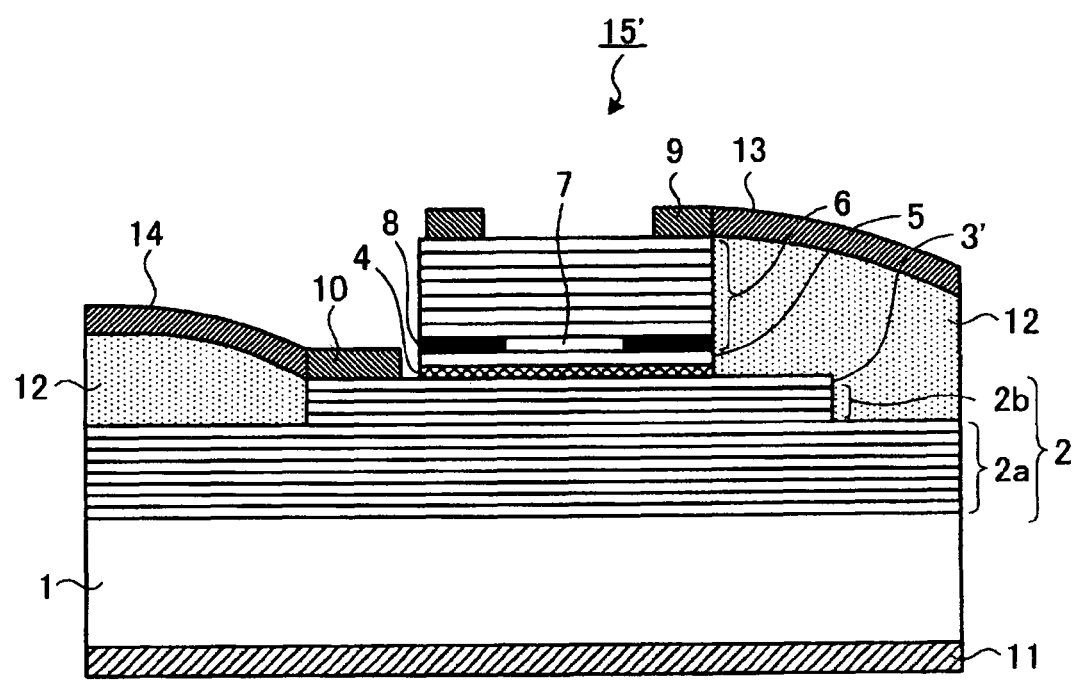
FIG. 3 is a cross sectional view showing a modified configuration of the surface emitting laser element array shown in FIG. 1.

Moreover, according to the present first embodiment, the second electrode 10 is formed on the second lower part DBR mirror 2b. Alternatively, as a surface emitting laser element 15' shown in FIG. 3, for example, a lower part cladding layer 3' may be provided to have a diameter enlarged from that of the lower part electrically conductive cladding layer 3 to be equal to the diameter of the lower part DBR mirror 2. The second electrode 10 is formed on the lower part cladding layer 3', and an entire portion of the lower part DBR mirror 2 becomes semi-insulating.

Further, according to the present first embodiment, there is provided the configuration that the backside surface of the substrate 1 is directly contacted to the mount substrate 17, and the laser light is emitted from the upper part DBR mirror 6 side, however, it may be also available to comprise a configuration that a mesa post side is connected to the mount substrate 17 using such as a flip-chip mounting technology or the like, and then laser light is emitted from the rear backside surface of the substrate 1. In a case of such the configuration, it is able to reduce a light loss through the lower part DBR mirror 2 because the laser light is emitted through the first lower part DBR mirror 2a formed of the semiconductor without doping the impurity.

Furthermore, according to the present first embodiment, the surface emitting laser elements 15 are aligned in one-dimensional on the mount substrate 17 as the surface emitting laser element array 16. It is not necessary to limit the alignment in one-dimensional, and it is able to align in two-dimensional as well. Even in such the case, it is able to connect electrically between the second electrode 10 and the third electrode 11 as well, by arranging the third electrode 11 on the ground electrode 18 regarding the individual surface emitting laser elements 15, and by connecting the second electrode 10 to the ground electrode 18 via the electrode pad 14 and the bonding wire 19.

The Second Embodiment

Next, the second embodiment according to the present invention will be described in detail below. According to the surface emitting laser element 15 regarding the above descried first embodiment, there is provided the preferable property as the laser element capable of obtaining the laser emission in high efficiency because the electric current is injected efficiently into the active layer 4. However, when a high voltage is applied to the surface emitting laser element 15, a current density inside the aperture 7 tends to increase because the current path is t limited to inside the aperture 7. Further, it is easy to bring a catastrophic damage and/or deterioration in the vicinity of the current blocking layer 8. Generally, regarding a surface emitting laser element with using a DBR mirror, such as the surface emitting laser element 15, it is easy to bring the catastrophic damage in the vicinity of an aperture due to applying a high voltage, because an electric current passed via the DBR mirror is concentrated inside the aperture formed of a current blocking layer. Regarding the high voltage such as a static electricity in particular, there are problems that it is easy to bring the electro static damage (ESD) and an ESD voltage tends to decrease.

Normally, a protection circuit is provided in a package that a semiconductor laser element is built therein or in a driving circuit for a semiconductor laser element so as not to be applied a high voltage to such the semiconductor laser element. However, it is difficult to prevent completely the high voltage from being applied. Moreover, it is important to improve a withstand voltage of the semiconductor laser element itself, because the static electricity occurs in a step of dicing a semiconductor laser element in a chip form or in an assembly process such as a step of mounting the semiconductor laser element to a package or the like. Further, regarding a surface emitting laser element array wherein surface emitting laser elements as semiconductor laser elements are integrated as an array form, when just one of the surface emitting laser elements is damaged, a function of the surface emitting laser element array as a whole is remarkably deteriorated, thereby making it difficult to use the surface emitting laser element array for a desired application. Accordingly, it is desirable to improve the withstand voltage of the surface emitting laser elements against the static electricity or the like.

Figures 1, 4:
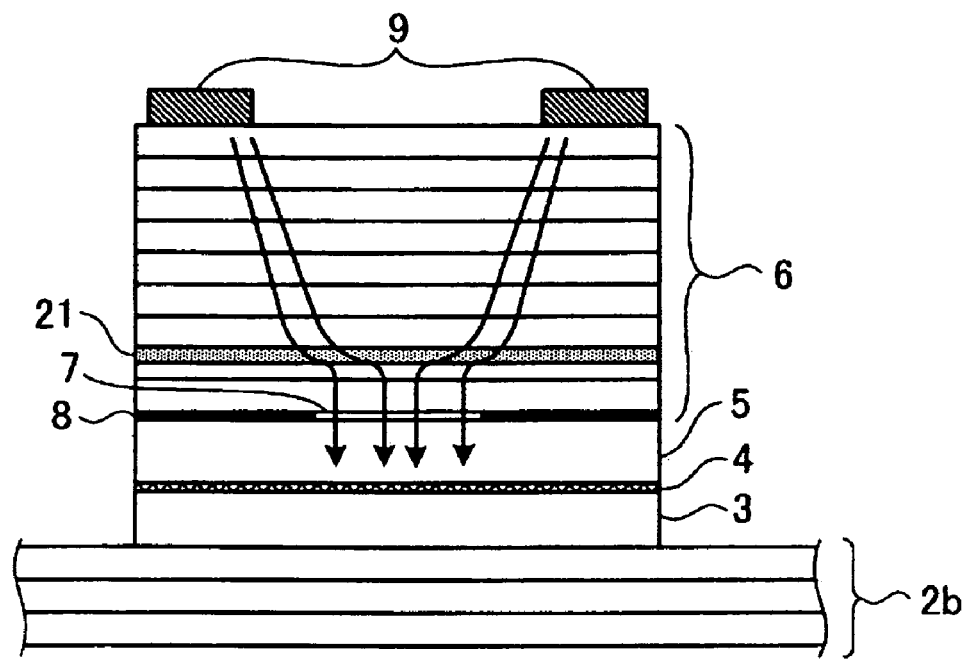
Figures 2, 4:
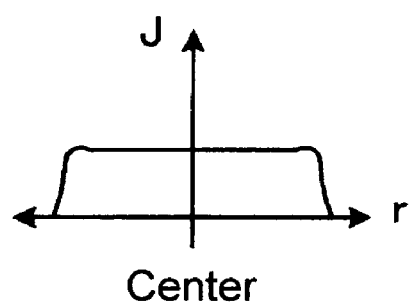

FIG. 4-1 is a cross sectional view showing a configuration of a mesa post part of a surface emitting laser element provided in a surface emitting laser element array according to the present second embodiment. In the surface emitting laser element array according to the present second embodiment, a plurality of the surface emitting laser elements is aligned in a configuration similar to that in the surface emitting laser element array 16 according to the first embodiment. Moreover, as shown in FIG. 4-1, each of the individual surface emitting laser elements further comprises a current equalizer layer 21 inside the upper part DBR mirror 6 according to the surface emitting laser element 15 for equalizing a current distribution inside the aperture 7.

Moreover, the current equalizer layer 21 is provided at the other side of the active layer 4 for the current blocking layer 8. Further, it is preferable to provide such the current equalizer layer 21 to be adjacent to the current blocking layer 8, that is, it is preferable to provide next to the current blocking layer 8 or to provide at a location within a distance of 500 nm at the maximum from the current blocking layer 8. In a case where the current blocking layer 8 and the current equalizer layer 21 are not contacted, it is preferable to be as a normal DBR mirror for a layer existing therebetween. Still further, it is desirable to be a layer having an electrical resistivity for the current equalizer layer 21 lower than any one of a high refractive index layer or of a low refractive index layer to form the upper part DBR mirror 6 (referred to as a low electrical resistivity layer hereinafter), and it is preferable to be with a thickness of between 5 nm and 100 nm therefor. Or, it is able to be a layer having an electrical resistivity for the current equalizer layer 21 higher than any one of the high refractive index layer or of the low refractive index layer to form the upper part DBR mirror 6 (referred to as a high electrical resistivity layer hereinafter) as well.

Here, regarding the low electrical resistivity layer to function as the current equalizer layer 21, at least one kind or more of elements to be selected from C, Zn and Be is doped as a p-type dope in a range between $5\times10^{18}$ cm$^{-3}$ and $1\times10^{20}$ cm$^{-3}$ into one layer at least or into an interface of at least one layer of the $Al_{0.9}Ga_{0.1}As$ layer or the $Al_{0.2}Ga_{0.8}As$ layer to be used as the layer to form the upper part DBR mirror 6 for example. In a case of providing the high electrical resistivity layer as the current equalizer layer 21, it is able to use a material, such as a GaInP, an AlGaInP, an AlGaAs, or the like.

Here, a dimension of each part regarding the mesa post part as shown in FIG. 4-1 is set as below for example. That is to say, a diameter of the mesa post part is to be between 20 μm and 50 μm, a thickness of the current blocking layer 8 is to be between 10 nm and 60 nm, and an area of a part for an electric current to be injected, that is to say, a diameter of the aperture 7 is to be between 5 μm and 15 μm.

Figures 1, 5:
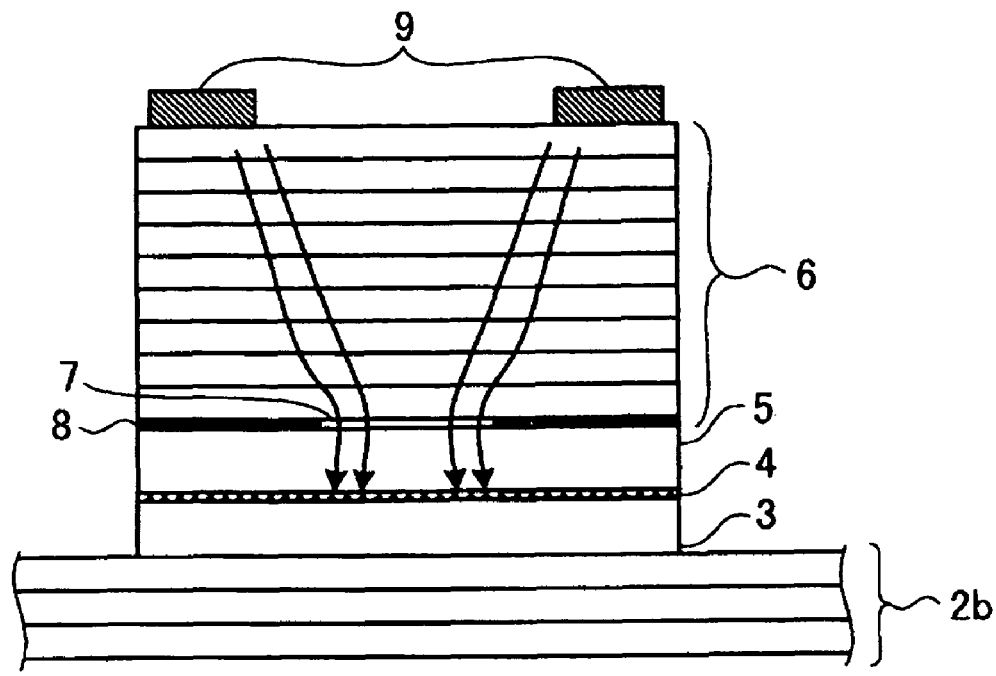
Figures 2, 5:
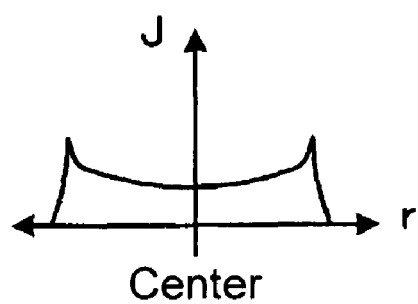

Next, advantages regarding the current equalizer layer 21 will be described in detail below. FIG. 5-1 is a cross sectional view showing a configuration and a current path in a case of excluding the current equalizer layer 21 from the mesa post part as shown in FIG. 4-1. Such the mesa post structure corresponds to the mesa post structure of the surface emitting laser element according to the conventional technology. Moreover, FIG. 5-2 is a view showing a current density distribution in a radial direction of the aperture 7 inside regarding the mesa post as shown in FIG. 5-1. A horizontal axis (an r-axis) designates a position in a radial direction regarding the aperture 7, and a vertical axis (a J-axis) designates a current density corresponding to the position in the radial direction. Regarding the mesa post as shown in FIG. 5-1, there is arranged a p-side electrode (a first electrode) 9 of ring shape at a fringe part of a top surface thereof, and then light is emitted from an open part at a central thereof. At such the mesa post inside, an electric current flows therethrough for a resistance becoming lower, that is to say, it flows through the shortest path for a same material inside as designating with arrows in the figure, and then the current density becomes to be higher at a marginal part of the aperture 7 of the current blocking layer 8 inside, as shown in FIG. 5-2.

On the contrary, FIG. 4-2 is a view showing a current density distribution in a radial direction of the aperture 7 inside regarding the mesa post as shown in FIG. 4-1. In such the mesa post, electric currents flocks at the aperture 7 inside as shown with arrows in FIG. 4-1, however, a current becomes easy to be flowed in a plane parallel direction to a surface of the current blocking layer 8, due to the current equalizer layer 21 arranged in the vicinity of the current blocking layer 8. Hence, a current density of the electric current is equalized in the vicinity of the current blocking layer 8, and then the current density of the current flowing into the aperture 7 inside becomes to be leveled equalized, as shown in FIG. 4-2. Thus, a value of the maximum current density at the marginal part of the aperture 7 is equalized and smaller comparing to the mesa post structure as shown in FIG. 5-1, in a case of similar amount of the electric current flowing through the current blocking layer 8, and then it becomes able to suppress a breakdown catastrophic damage in the vicinity of the current blocking layer 8 due to occurring a local Joule heat.

As above described, according to the surface emitting laser element provided in the surface emitting laser element array according to the present second embodiment, there is provided the current equalizer layer 21 at the upper part DBR mirror 6 side in the vicinity of the current blocking layer 8, and then the current density distribution in the aperture 7 is equalized. Thus, it becomes possible to suppress a catastrophic damage of the laser element in the vicinity of the current blocking layer 8 due to occurring the local Joule heat at the time of a high voltage, such as the static electricity or the like, being applied to the surface emitting laser element, and then it becomes able to improve the property of the withstand voltage of the surface emitting laser element itself. Moreover, the current density distribution of the electric current to be injected into the active layer 4 is equalized as well, and then an optical mode distribution and the current density distribution at the period of laser emission becomes to be further similar, by equalizing the current density for the current blocking layer 8. Thus, it becomes able to obtain an advantage of improving luminous efficiency as well.

Modified Examples

Figure 6:
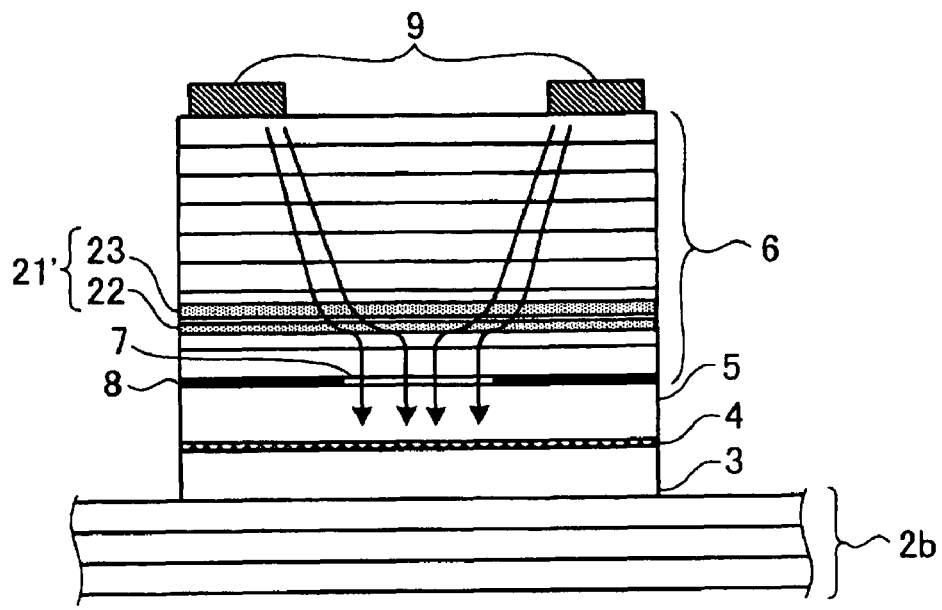
FIG. 6 is a cross sectional view showing a configuration regarding a mesa post of a surface emitting laser element provided in a surface emitting laser element array according to a modified example of the second embodiment.
Figure 7:
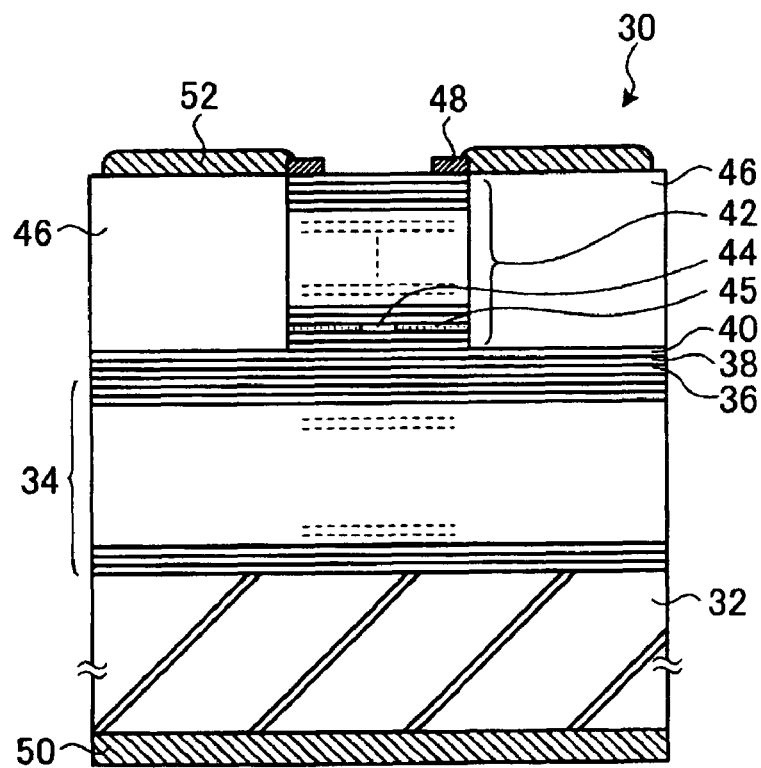
FIG. 7 is a cross sectional view of a conventional surface emitting laser element.
Figure 8:
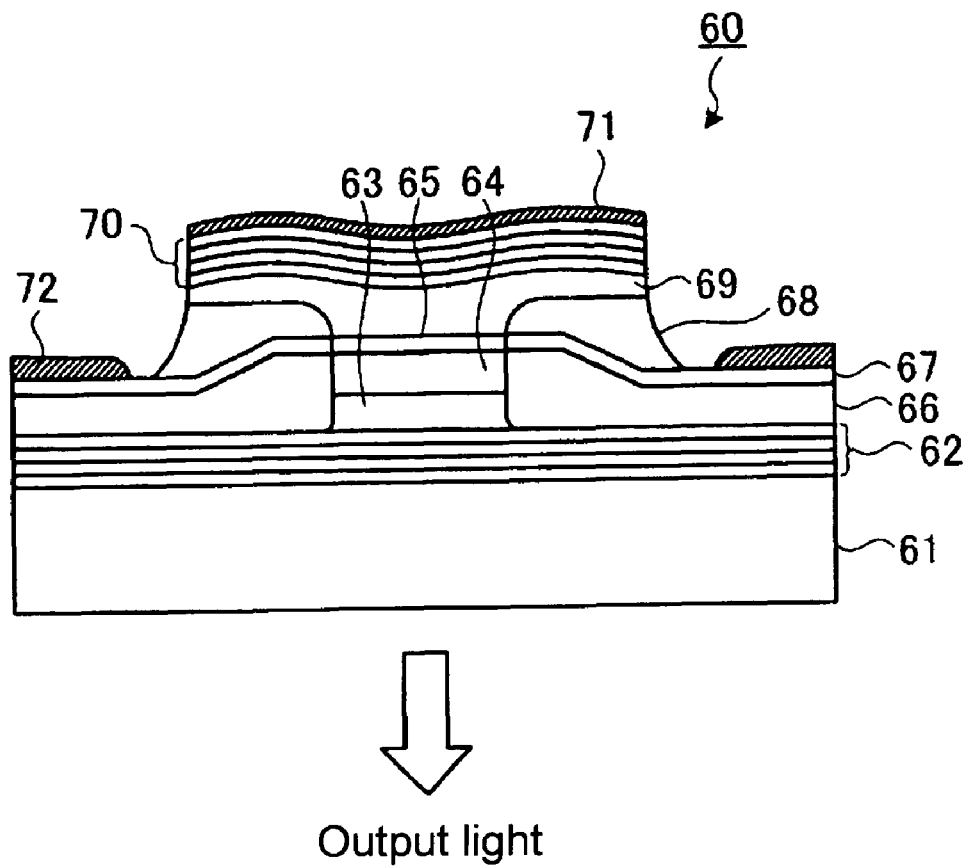
FIG. 8 is a cross sectional view of another conventional surface emitting laser element.

Next, modified examples according to the above described second embodiment will be described in detail below. FIG. 6 is a cross sectional view showing a configuration regarding a mesa post part of a surface emitting laser element provided in a surface emitting laser element array according to the present modified example. As shown in this figure, there is provided a current equalizer layer 21' to be formed in a layer form using a high electrical resistivity layer 22 and a low electrical resistivity layer 23 in place of the current equalizer layer 21 at a mesa post part according to the present modified example. Moreover, the high electrical resistivity layer 22 has an electrical resistivity higher than that of individual layers to comprise a upper part DBR mirror 6, and the low electrical resistivity layer 23 has an electrical resistivity lower than that of the individual layers to comprise the upper part DBR mirror 6, and the high electrical resistivity layer 22 is arranged in a layer form between a current blocking layer 8 and the low electrical resistivity layer 23. It is possible to efficiently equalizing a current density inside the aperture 7 regarding the surface emitting laser element according to the present modified example.

So far, there is described the best mode for carrying out the present invention as the first and the second embodiments, however, the present invention is not limited to the above described first and the second embodiments, and it is possible to modify in a variety thereof without departing from the subject of the present invention.

For example, according to the above described second embodiment, the lower part DBR mirror 2 and the upper part DBR mirror 6 are formed using the n-type semiconductor and the p-type semiconductor respectively, however, it may be available to replace the polarity for the upper and the lower parts as well. That is to say, it may be available to form a lower part DBR mirror using a p-type semiconductor, and then to provide a current equalizer layer 21 or 21' at such the lower part DBR mirror inside. In such the case, a current blocking layer 8 and an aperture 7 are to be provided at a region in the vicinity of the lower part DBR mirror or inside thereof, and then the current equalizer layer 21 or 21' are provided at the other side, that is to say, a lower side, of an active layer 4 for the current blocking layer 8. Moreover, a high electrical resistivity layer 22 may have an electrical resistivity higher than that of individual layers to comprise the lower part DBR mirror, and a low electrical resistivity layer 23 may have an electrical resistivity lower than that of the individual layers to comprise the lower part DBR mirror.

Moreover, according to the above described second embodiment, the current blocking layer and the current equalizer layer are provided at the inside of the DBR mirror, however, it may be available to provide a current blocking layer at an inside of a cladding layer as well. In such the case where the current blocking layer is provided at the inside of the cladding layer, it is able to provide a current equalizer layer at the inside of the cladding layer or of a DBR mirror.

Further, according to the above described first and the second embodiments, the p-type semiconductor to comprise the DBR mirror is to be the semiconductor formed in the layered form which is designated as p-$Al_{0.9}Ga_{0.1}As$/p-$Al_{0.2}Ga_{0.8}As$, however, it is not necessary to interpret with being limited thereto, and it may be available to be a semiconductor formed in a layered form therefor which is generally designated as p-$Al_xGa_{1-x}As$/p-$Al_yGa_{1-y}As$ ($0 \leq x \leq 1$, $0 \leq y \leq 1$).

INDUSTRIAL APPLICABILITY

As above described, the surface emitting laser element array according to the present invention is useful for a surface emitting laser element array comprises a plurality of surface emitting laser elements arranged on a same substrate, wherein each thereof comprises a mesa post part respectively, and a resonator structure in a vertical direction for the substrate respectively, and in particular, it is suitable for a surface emitting laser element array for which a low crosstalk and a high speed response are required.

What is claimed is:

1. A surface emitting laser element array comprising:
   a plurality of surface emitting laser elements formed in an array pattern on a top surface of a substrate, wherein
   each of the surface emitting laser elements includes
      a lower DBR mirror formed on the substrate,
      a lower cladding layer formed on the lower DBR mirror,
      an active layer formed on the lower cladding layer,
      an upper cladding layer formed on the active layer,
      an upper DBR mirror,
      a mesa post formed of a layered structure including at least the active layer, the upper cladding layer, and the upper DBR mirror,
      a first electrode formed on a first side of the substrate, a second electrode formed on the first side of the substrate, the second electrode having a polarity opposite to that of the first electrode, and a third electrode formed on a second side of the substrate opposite to the first side of the substrate, the third electrode having a polarity the same as that of the second electrode, the third electrode is a common electrode for the surface emitting laser elements, an electric current is applied to the active layer through the first electrode and the second electrode, the lower DBR mirror includes a semi-insulating first lower DBR mirror formed on the substrate, and an electrically-conductive second lower DBR mirror formed on the first lower DBR mirror, and the second electrode is electrically connected to the third electrode.

2. The surface emitting laser element array according to claim 1, wherein the second electrode is electrically connected to the third electrode via a ground.

3. The surface emitting laser element array according to claim 1, wherein the first electrode is formed on the upper DBR mirror, the second electrode is formed on the second lower DBR mirror, and the third electrode is formed on a bottom surface of the substrate.

4. The surface emitting laser element array according to claim 1, wherein the first electrode is formed on the upper DBR mirror, the layered structure forming the mesa post further includes the lower cladding layer, the second electrode is formed on the lower cladding layer, and the third electrode is formed on a bottom surface of the substrate.

5. The surface emitting laser element array according to claim 3, wherein each of the surface emitting laser elements further includes a current blocking layer provided in any one of the lower cladding layer, the upper cladding layer, the lower DBR mirror, and the upper DBR mirror, and a current equalizer layer provided at a region near the current blocking layer for equalizing a current distribution in an opening formed by the current blocking layer.

6. The surface emitting laser element array according to claim 5, wherein the current blocking layer is provided in either one of the upper cladding layer and the upper DBR mirror in the mesa post.

7. The surface emitting laser element array according to claim 5, wherein either one of the lower DBR mirror and the upper DBR mirror is formed of a p-type semiconductor, and said current equalizer layer is provided in either one of the lower DBR mirror and the upper DBR mirror on a side of the current blocking layer opposite to the active layer.

8. The surface emitting laser element array according to claim 7, wherein the p-type semiconductor includes a semiconductor formed in a layered structure as represented with p-$Al_xGa_{1-x}As$/p-$Al_yGa_{1-y}As$ ($0 \leq x \leq 1$, $0 \leq y \leq 1$).

9. The surface emitting laser element array according to claim 5, wherein the current equalizer layer has an electrical resistivity lower than that of a layer constituting at least one of the lower DBR mirror and the upper DBR mirror.

10. The surface emitting laser element array according to claim 5, wherein said current equalizer layer has an electrical resistivity higher than that of a layer constituting at least one of the lower DBR mirror and the upper DBR mirror.

11. The surface emitting laser element array according to claim 5, wherein the current equalizer layer is formed of a layered structure including a low electrical resistivity layer having an electrical resistivity lower than that of a layer constituting at least one of the lower DBR mirror and the upper DBR mirror, and a high electrical resistivity layer having an electrical resistivity higher than, that of the layer and is arranged as a layer between the current blocking layer and the low electrical resistivity layer.

12. The surface emitting laser element array according to claim 5, wherein the current equalizer layer is formed of one layer constituting the lower DBR mirror or the upper DBR mirror, or an interface of the one layer with an impurity of not less than $5 \times 10^{18}$ cm$^{-3}$ doped therein.

13. The surface emitting laser element array according to claim 4, wherein each of the surface emitting laser elements further includes a current blocking layer provided in any one of the lower cladding layer, the upper cladding layer, the lower DBR mirror, and the upper DBR mirror, and a current equalizer layer provided at a region near the current blocking layer for equalizing a current distribution in an opening formed by the current blocking layer.

14. The surface emitting laser element array according to claim 13, wherein the current blocking layer is provided in either one of the upper cladding layer and the upper DBR mirror in the mesa post.

15. The surface emitting laser element array according to claim 13, wherein either one of the lower DBR mirror and the upper DBR mirror is formed of a p-type semiconductor, and the current equalizer layer is provided in either one of the lower DBR mirror and the upper DBR mirror on a side of the current blocking layer opposite to the active layer.

16. The surface emitting laser element array according to claim 15, wherein the p-type semiconductor includes a semiconductor formed in a layered structure represented by p-$AlxGa1-xAs$/p-$AlyGa1-yAs$ ($0 \leq x \leq 1$, $0 \leq y \leq 1$).

17. The surface emitting laser element array according to claim 13, wherein the current equalizer layer has an electrical resistivity lower than that of a layer constituting at least one of the lower DBR mirror and the upper DBR mirror.

18. The surface emitting laser element array according to claim 13, wherein the current equalizer layer has an electrical resistivity higher than that of a layer constituting at least one of the lower DBR mirror and the upper DBR mirror.

19. The surface emitting laser element array according to claim 13, wherein the current equalizer layer is formed of a layered structure including a low electrical resistivity layer having an electrical resistivity lower than that of a layer constituting at least one of the lower DBR mirror and the upper DBR mirror and a high electrical resistivity layer having an electrical resistivity higher than that of the layer and is arranged as a layer between the current blocking layer and the low electrical resistivity layer.

20. The surface emitting laser element array according to claim 13, wherein the current equalizer layer is formed of one layer constituting the lower DBR mirror or the upper DBR mirror, or an interface of the one layer with an impurity of not less than $5 \times 10^{18}$ cm$^{-3}$ doped therein.

* * * * *